US010872666B2

(12) United States Patent
Fackenthal

(10) Patent No.: US 10,872,666 B2
(45) Date of Patent: Dec. 22, 2020

(54) SOURCE LINE MANAGEMENT FOR MEMORY CELLS WITH FLOATING GATES

(71) Applicant: Micron Technology, Inc., Boise, ID (US)

(72) Inventor: Richard E. Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/282,749

(22) Filed: Feb. 22, 2019

(65) Prior Publication Data

US 2020/0273521 A1     Aug. 27, 2020

(51) Int. Cl.
*G11C 16/04* (2006.01)
*G11C 16/26* (2006.01)
*G11C 16/10* (2006.01)
*G11C 16/08* (2006.01)

(52) U.S. Cl.
CPC .......... *G11C 16/0433* (2013.01); *G11C 16/10* (2013.01); *G11C 16/26* (2013.01); *G11C 16/08* (2013.01)

(58) Field of Classification Search
CPC ..... G11C 16/0433; G11C 16/26; G11C 16/10; G11C 16/08
See application file for complete search history.

(56) References Cited

U.S. PATENT DOCUMENTS

| | | |
|---|---|---|
| 2005/0185464 A1 | 8/2005 | Chih |
| 2009/0094410 A1 | 4/2009 | Kari et al. |
| 2009/0225584 A1 | 9/2009 | Rao |
| 2013/0051153 A1 | 2/2013 | Tailliet et al. |
| 2013/0301356 A1* | 11/2013 | Chiu ............... H01L 29/788 365/185.18 |
| 2014/0355357 A1 | 12/2014 | Tailliet |

OTHER PUBLICATIONS

ISA/KR, International Search Report and Written Opinion of the International Searching Authority, Int'l. Appl. No. PCT/US2020/017734, dated Jun. 16, 2020, Korean Intellectual Property Office, Seo-gu, Daejeon, Republic of Korea, 10 pgs.

* cited by examiner

*Primary Examiner* — David Lam
(74) *Attorney, Agent, or Firm* — Holland & Hart LLP

(57) ABSTRACT

Methods, systems, and devices for source line configurations for a memory device are described. In some cases, a memory cell of the memory device may include a first transistor having a floating gate for storing a logic state of the memory cell and a second transistor coupled with the floating gate of the first transistor. The memory cell may be coupled with a word line, a digit line, and a source line. During a write operation, the source line may be clamped to the digit line using one or more memory cells in the memory device. During a read operation, the source line may be grounded using one or more memory cells in the memory device.

9 Claims, 10 Drawing Sheets

SOURCE LINE MANAGEMENT FOR MEMORY CELLS WITH FLOATING GATES

BACKGROUND

The following relates generally to a system that includes at least one memory device and more specifically to source line configurations for memory cells with floating gates and techniques for using the same.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Some types of memory devices may bias (e.g., apply a voltage to) various access lines during read and write operations of a memory cell. These access lines may include word lines, digit lines, and/or other types of conductive lines that may be coupled with the memory cell.

DETAILED DESCRIPTION

Figure 1:
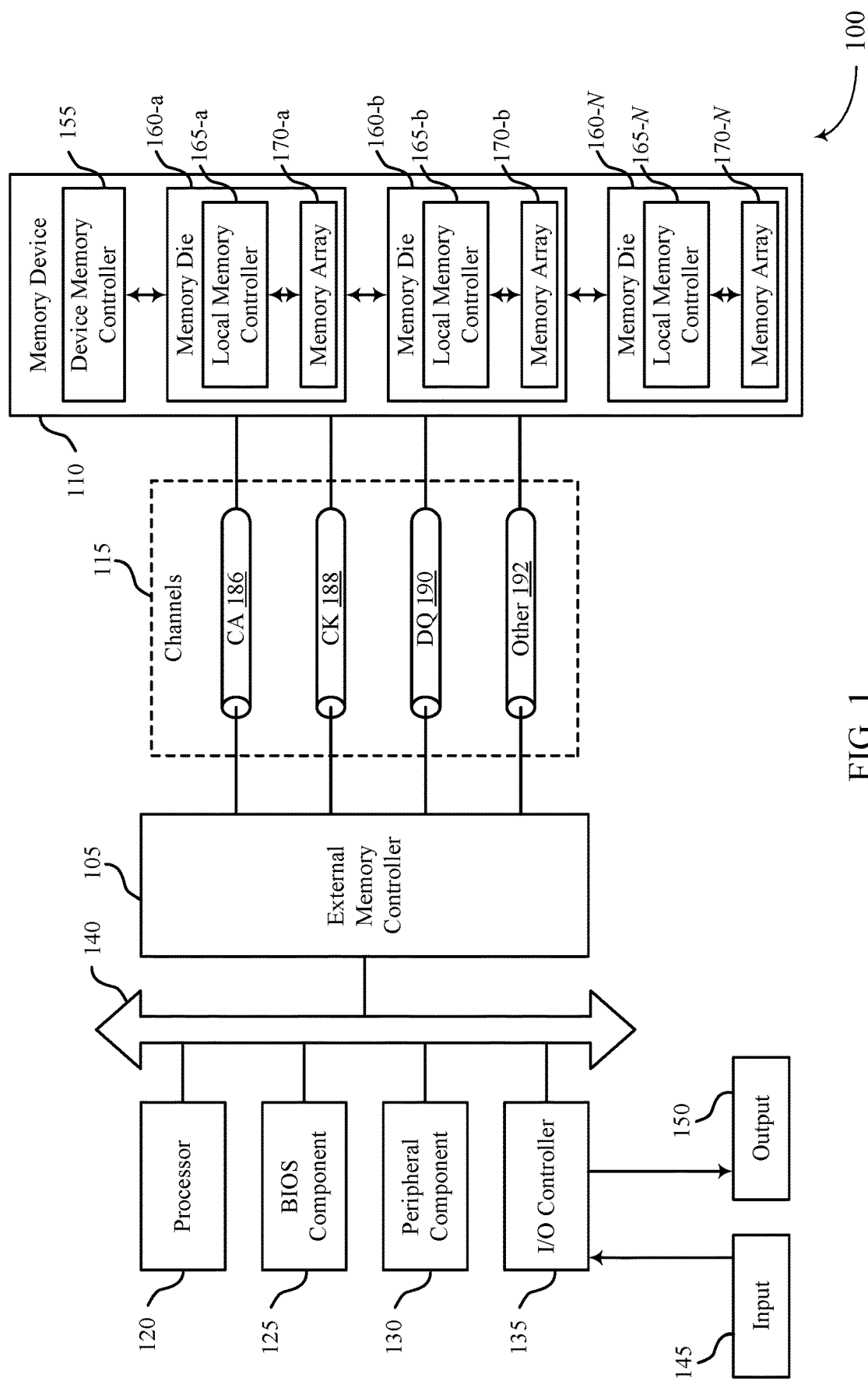
FIG. 1 illustrates an example of a system that supports source line configurations for a memory device in accordance with examples as disclosed herein.

A memory device may include one or more memory cells that are programmable to store different logic states. For example, a memory cell may store one bit of digital logic during operation (e.g., a logic 1 state and logic 0 state).

A memory cell may store a logic state using two transistors, one of which may be associated with a floating gate. The floating gate may be an electrical node that is in close proximity to a control gate of the transistor but is separated from the control gate by a dielectric material. A voltage or charge stored on the floating gate may affect a threshold voltage of the transistor associated with the floating gate and therefore may also affect an amount of current that flows through the transistor when a voltage is applied to the control gate. The amount of current that flows through the transistor may be "sensed" to determine the logic state stored by the memory cell. This type of memory cell, which may be referred to as a floating-gate memory cell, may not use a capacitor for storing the logic state. Instead, a memory cell with a floating gate may store the logic state based on a voltage of the floating gate.

A floating gate memory cell may include two transistors, a first transistor for storing a logic state and a second transistor for selectively accessing the floating gate of the first transistor. The description herein refers to the first transistor associated with the floating gate as a read transistor because this transistor may be activated during a read operation to read the state of the memory cell. The second transistor in the memory cell may be referred to as a write transistor because the second transistor may be activated during a write operation to apply a voltage to the floating gate of the first transistor.

A floating gate memory cell may be coupled with various access lines. These access lines may include a word line and a digit line, such as the word lines and digit lines used with other types of memory cells. A floating gate memory cell may also be coupled with an access line referred to as a source line.

A floating-gate memory cell may be read or written by biasing (e.g., applying a voltage to) the access lines associated with the memory cell, such as a word line, digit line, and source line. For example, a word line may be coupled with the control gates of the read transistor and write transistor and may be biased to select a target memory cell during a read or write operation. A digit line may be coupled with the drains of the read transistor and write transistor, and may be biased to apply a voltage to the floating gate during a write operation (via the write transistor) or to cause a current to flow between the digit line and a source line during a read operation (via the read transistor). The source line may be biased to a relatively low voltage (e.g., a ground voltage) during a read operation to enable electrical current to flow from the digit line to the source line via the read transistor.

In some cases, if the source line is biased to a low voltage during a write operation while the digit line is biased to a higher voltage to write a logic state to a selected memory cell, the voltage difference between the digit line and the source line may cause electrical current to flow through unselected memory cells that are coupled with the same digit line and source line. The cumulative leakage current may cause undesirable effects in the memory device. Thus, it may be desirable to bias the source line to the digit line voltage during a write operation to eliminate or mitigate unwanted current through unselected memory cells. That is, the source line may need to be biased differently depending on whether it is used for a read operation or a write operation.

In some cases, a source line may be biased by coupling the source line with a controller or voltage regulator that drives the source line to an appropriate voltage depending on the access operation. Using this approach, however, the source lines may be brought out of a block of memory cells associated with the memory device (e.g., out of a patch or a tile of memory cells), which may be expensive.

To avoid bringing source lines out of the corresponding block of memory cells, in some cases, source lines may be biased using other floating-gate memory cells that are fabricated on the same die as the array of memory cells. These other floating-gate memory cells may be coupled with the source lines of memory cells in the array and may be configured to bias the source lines to appropriate voltages depending on the operation (read or write).

For example, in some cases, a memory die may include memory cells that are coupled with the source lines and with the digit lines and are configured to clamp (e.g., couple) the source lines with the corresponding digit lines during a write operation. In some cases, a memory die may include memory cells that are coupled with the source lines and with a ground node and used to ground the source lines during a read operation. In this manner, source lines may be biased appropriately using memory cells present on the block of memory cells, rather than by bringing the source lines out of the block of memory cells.

Features of the disclosure are initially described in the context of a memory system and memory die as described with reference to FIGS. 1 and 2. Features of the disclosure are described in the context memory devices and timing diagrams as described with reference to FIGS. 3-7. These and other features of the disclosure are further illustrated by and described with reference to an apparatus diagram and flowcharts that relate to use of source line management as described with references to FIGS. 8-10.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some cases, the host device may be an example of a graphics processing unit (GPU).

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a GPU, a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s)

130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110.

The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

In some cases, memory device 110 may receive a command to perform a write operation on a memory cell that has a first transistor having a floating gate for storing a logic state of the memory cell and a second transistor coupled with the floating gate. In some cases, the external memory controller 105, device memory controller 155, and/or local memory controller 165 may be configured to cause the memory device to couple, based on receiving the command, a source line with a digit line, the source line coupled with the first transistor and the digit line coupled with the second transistor, apply a first voltage to the digit line, applying a second voltage to the floating gate of the first transistor by activating the second transistor, the second voltage based at least in part on the first voltage, and store the logic state to the memory cell by deactivating the second transistor. In some cases, the logic state is based on the second voltage.

In some cases, memory device 110 may receive a command to perform a read operation on a memory cell that has a first transistor having a floating gate for storing a logic state of the memory cell and a second transistor coupled with the floating gate. In some cases, the external memory controller 105, device memory controller 155, and/or local memory controller 165 may be configured to ground a source line coupled with the first transistor, apply a first voltage to a digit line that is coupled with the second transistor of the memory cell, and determine the logic state stored on the memory cell based on applying the first voltage to the digit line and grounding the source line.

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
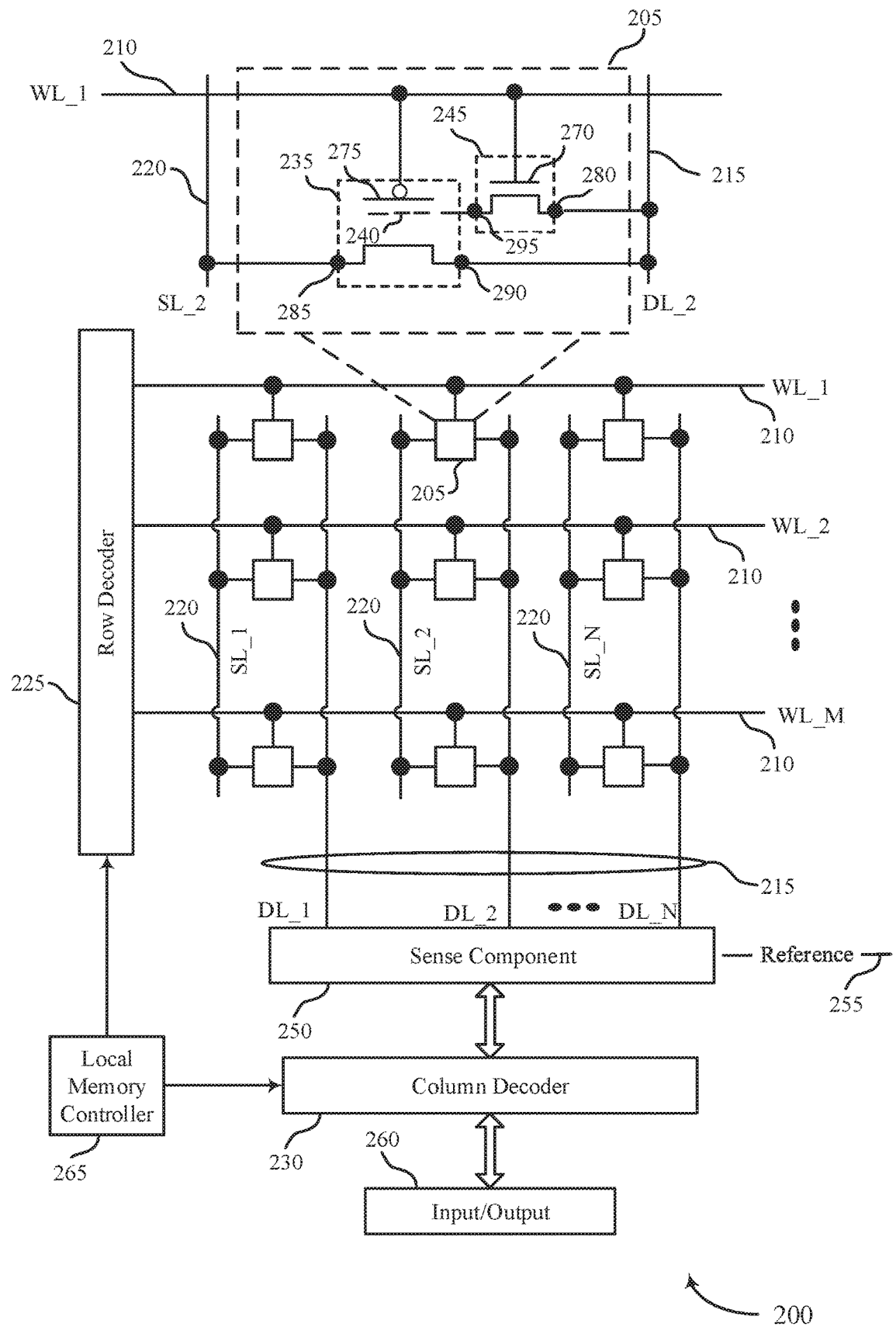
FIG. 2 illustrates an example of a memory die that supports source line configurations for a memory device in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state that represents digital data. In dynamic random access memory (DRAM) architectures or ferroelectric random access memory (FeRAM) architectures, the memory cell 205 may include a capacitor that includes a dielectric material to store a charge representative of the programmable state. In floating gate memory architectures, the memory cell 205 may include two transistors, one of which is associated with a floating gate. The floating gate may be configured to store a charge representative of the programmable state.

Operations such as reading and writing may be performed on floating-gate memory cells 205 by activating, selecting, or biasing access lines such as a word line 210, a digit line 215, and/or a source line 220. In some cases, digit lines 215 may also be referred to as bit lines. References to access lines, word lines, digit lines, source lines or their analogues, are interchangeable without loss of understanding or operation. Activating, selecting, or biasing a word line 210, a digit line 215, or a source line 220 may include applying a voltage to the respective line.

The memory die 200 may include access lines (e.g., the word lines 210, the digit lines 215, and the source lines 220) arranged in a grid-like pattern. Memory cells 205 may be positioned at intersections of the word lines 210, the digit lines 215, and/or the source lines 220. By biasing a word line 210, a digit line 215, and a source line 220 (e.g., applying a voltage to the word line 210, digit line 215, or source line 220), a single memory cell 205 may be accessed at their intersection.

Accessing the memory cells 205 may be controlled through a row decoder 225 and a column decoder 230. For example, a row decoder 225 may receive a row address from the local memory controller 265 and activate a word line 210 based on the received row address. A column decoder 230 receives a column address from the local memory controller 265 and activates a digit line 215 based on the received column address.

For example, the memory die 200 may include multiple word lines 210, labeled WL_1 through WL_M, multiple digit lines 215, labeled DL_1 through DL_N, and multiple source lines, labeled SL_1 through SL_N, where M and N depend on the size of the memory array. In some cases, the quantity of source lines N corresponds to the quantity of digit lines N such that each digit line 215 has a corresponding source line 220 that is associated with the same memory cells 205 as the digit line 215. Thus, by activating or biasing a word line 210, a digit line 215, and a source line 220, e.g., WL_1, DL_2, and SL_2, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a source line 220 may be referred to as an address of the memory cell 205.

The memory cell 205 may include a read transistor 235 associated with a floating gate 240 and a write transistor 245. Read transistor 235 and write transistor 245 may be used together to read and write logic states to memory cell 205.

Floating gate 240 may be used to store a charge or voltage representing a logic state of memory cell 205. Floating gate 240 may be an electrical node that is located near a control gate 275 of read transistor 235 such that a charge or voltage on floating gate 240 may affect a threshold voltage associated with read transistor 235. A control gate 275 may be a gate of a transistor that is used to activate or deactivate the transistor, for example. Read transistor 235 may be associated with floating gate 240 at least because a threshold voltage of read transistor 235 may be affected by a charge or voltage on floating gate 240. A threshold voltage may be a minimum voltage that must be applied to a control gate of a transistor to fully activate the transistor and couple the source node of the transistor with the drain node of the transistor.

In some cases, read transistor 235 may include floating gate 240. That is, read transistor 235 may be a floating-gate transistor that includes floating gate 240. In some cases, read transistor 235 may be a transistor (e.g., not a floating-gate transistor) that does not include floating gate 240. In this case, floating gate 240 may be an electrical node that is fabricated in close proximity to a control gate of read transistor 235, but is not included within read transistor 235. Floating gate 240 may be coupled with a drain node 295 of write transistor 245.

In some cases, read transistor 235 may be a first type of transistor (p-type, n-type) and write transistor 245 may be a second type of transistor (n-type, p-type). For example, read transistor 235 may be a p-type transistor and write transistor may be an n-type transistor, or the reverse. For simplicity, read transistor 235 is assumed to be a p-type transistor and write transistor 245 is assumed to be an n-type transistor in the disclosure herein, although the reverse may also be used. Similarly, references to source nodes and drain nodes of read transistor 235 and write transistor 245 may be reversed. In some cases, the read transistor 235 and the write transistor 245 may be the same type of transistor (e.g., both p-type or both n-type).

A word line 210 may be a conductive line coupled with a memory cell 205 that is used to perform access operations on the memory cell 205. In some architectures, the word line 210 may be coupled with a control gate 275 of read transistor 235 and with a control gate 270 of write transistor 245. In some cases, the word line 210 may be configured to control activation of the read transistor 235 and the write transistor 245 during memory cell accesses by applying a voltage to control gate 275 and control gate 270. In some cases, because read transistor 235 and write transistor 245 are different type transistors, applying a voltage to word line 210 may activate either read transistor 235 or write transistor 245 but may not activate both transistors at the same time. In some cases, word line 210 may be biased, during a read operation, to a voltage that activates read transistor 235 but does not activate write transistor 245. In some cases, word line 210 may be biased, during a write operation, to a voltage that activates write transistor 245 but does not activate read transistor 235.

A digit line 215 may be a conductive line that connects the memory cell 205 with a sense component 250 and is used to perform access operations on the memory cell 205. Digit line 215 may be connected with a source node 280 of write transistor 245 and with a drain node 290 of read transistor 235.

A source line 220 may be a conductive line coupled with a memory cell 205 that is used to perform access operations on the memory cell 205. The source line 220 may be coupled with a source node 285 of the read transistor 235. In some memory devices, a common source line (e.g., a source plate) may be coupled with every memory cell. In such memory devices, access operations (e.g., read operations or write operations) may cause disturbances on other rows or columns. In some memory devices may not include a common source line or source plate, but may instead include source lines associated with digit lines. In such examples, a single source line may be associated with a single digit line. Such an architecture may reduce or mitigate disturbances during access operations, but may increase the components associated with the source lines (e.g., drivers and such). Source line configurations are described herein that include a source line associated with a digit line.

During a write operation, word line 210 may be biased to a write voltage that activates write transistor 245, and digit line 215 may be biased to a state voltage that is based on the logic state to be stored by memory cell 205. For example, digit line 215 may be biased to a higher voltage to store a logic state of "1" and a lower voltage to store a logic state of "0." Activating write transistor 245 may couple the source node 280 of write transistor 245 with the drain node 295 of write transistor 245, thereby causing a voltage to be applied to floating gate 240 that is based on the voltage of digit line 215. After the voltage has been applied to the floating gate 240, word line 210 may be biased to a voltage that deactivates write transistor 245, thereby isolating the floating gate 240 and storing the applied voltage on floating gate 240. In some cases, read transistor 235 may remain inactive during the write operation.

During a read operation, word line 210 may be biased to a read voltage that may activate read transistor 235, and write transistor 245 may remain inactive. Activating read transistor 235 may couple a drain node 290 of read transistor 235 with a source node 285 of read transistor 235, thereby coupling digit line 215 with source line 220. During the read operation, digit line 215 may be biased to a small positive voltage and source line 220 may be grounded such that an electrical current may flow from digit line 215 to source line 220 when read transistor 235 is activated. The amount of current that flows from digit line 215 to source line 220 may be affected by the state stored by memory cell 205. That is, the voltage or charge stored on floating gate 240 may affect the threshold voltage associated with read transistor 235, thereby affecting the level of activation of read transistor 235 in response to the read voltage. The level of activation of read transistor 235 may, in turn affect the amount of current that flows between the digit line 215 and the source line 220.

The sense component 250 may be configured to detect a state (e.g., a charge or voltage) stored on floating gate 240 of the memory cell 205 and determine a logic state of the memory cell 205 based on the detected state. In some cases, sense component 250 may detect the state by detecting an amount of electrical current flowing between digit line 215 and source line 220 during a read operation, which may be considered as a signal output by the memory cell 205.

In some cases, the sense component 250 may include one or more sense amplifiers to amplify the signal output of the memory cell 205. The sense amplifiers may detect minute changes in the current along a digit line 215 during a read operation and may produce signals corresponding to either a logic 0 or a logic 1 based on the detected current.

The sense component 250 may be configured to compare the signal received from the memory cell 205 across the digit line 215 to a reference signal 255 (e.g., a reference voltage or current). The sense component 250 may determine the stored state of the memory cell 205 based on the comparison. For example, in binary-signaling, if digit line 215 has a higher voltage or current than the reference signal 255, the sense component 250 may determine that the stored state of memory cell 205 is a logic 1, and, if the digit line 215 has a lower voltage or current than the reference signal 255, the sense component 250 may determine that the stored state of the memory cell 205 is a logic 0. The sense component 250 may include various transistors or amplifiers to detect and amplify a difference in the signals. The detected logic state of memory cell 205 may be output through column decoder 230 as output 260. In some cases, the sense component 250 may be part of another component (e.g., a column decoder 230, row decoder 225). In some cases, the sense component 250 may be in electronic communication with the row decoder 225 and/or the column decoder 230.

The local memory controller 265 may control the operation of memory cells 205 through the various components (e.g., row decoder 225, column decoder 230, and sense component 250). The local memory controller 265 may be an example of the local memory controller 165 described with reference to FIG. 1. In some cases, one or more of the row decoder 225, column decoder 230, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or source line address signals to bias or activate the target word line 210, the target digit line 215, and the target source line 220. The local memory controller 265 may also generate and control various voltages or currents used during the operation of the memory die 200. In general, the amplitude, shape, or duration of an applied voltage or current described herein may be adjusted or varied and may be different for the various operations described in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target source line 220 coupled with the target memory cell 205 (e.g., the address of the target memory cell 205). The local memory controller 265 may activate the target word line 210, the target digit line 215, and/or the target source line 220 (e.g., applying a voltage to the word line 210, digit line 215, or the source line 220), to access the target memory cell 205. The local memory controller 265 may apply a specific signal (e.g., voltage) to the digit line 215 during the write operation to store a specific state on the floating gate 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target source line 220 in coupled with the target memory cell 205 (e.g., the address of the target memory cell 205). The local memory controller 265 may activate the target word line 210, the target digit line 215, and/or a target source line 220 (e.g., applying a voltage to the word line 210, the digit line 215, or the source line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a floating-gate memory cell may destroy the logic state stored on the floating gate. The local memory controller 265 may perform a re-write operation or a refresh operation to return the memory cell 205 to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells coupled with that access line. Thus, a re-write operation or refresh operation may be performed on one or more memory cells that may not have been accessed.

Figure 3A:
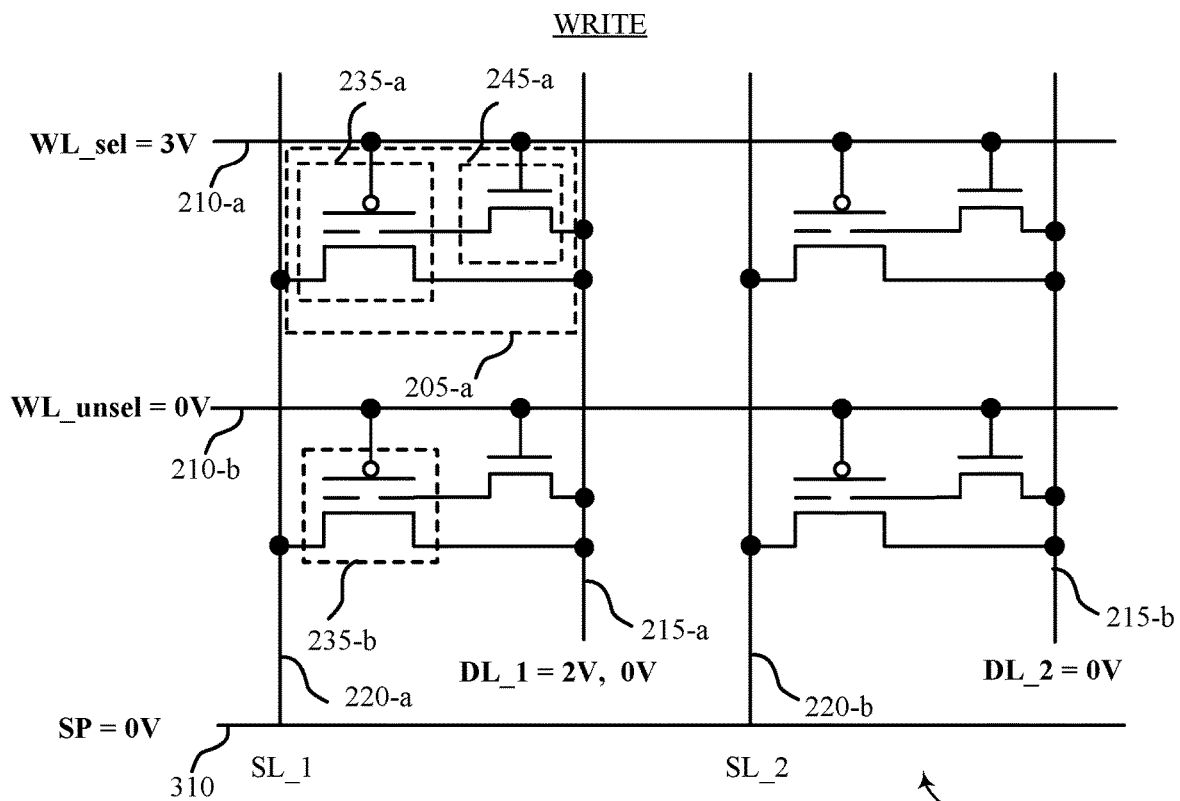
FIGS. 3A and 3B illustrate examples of access line biasing of a memory device that supports source line configurations for a memory device in accordance with examples as disclosed herein.
Figure 3B:
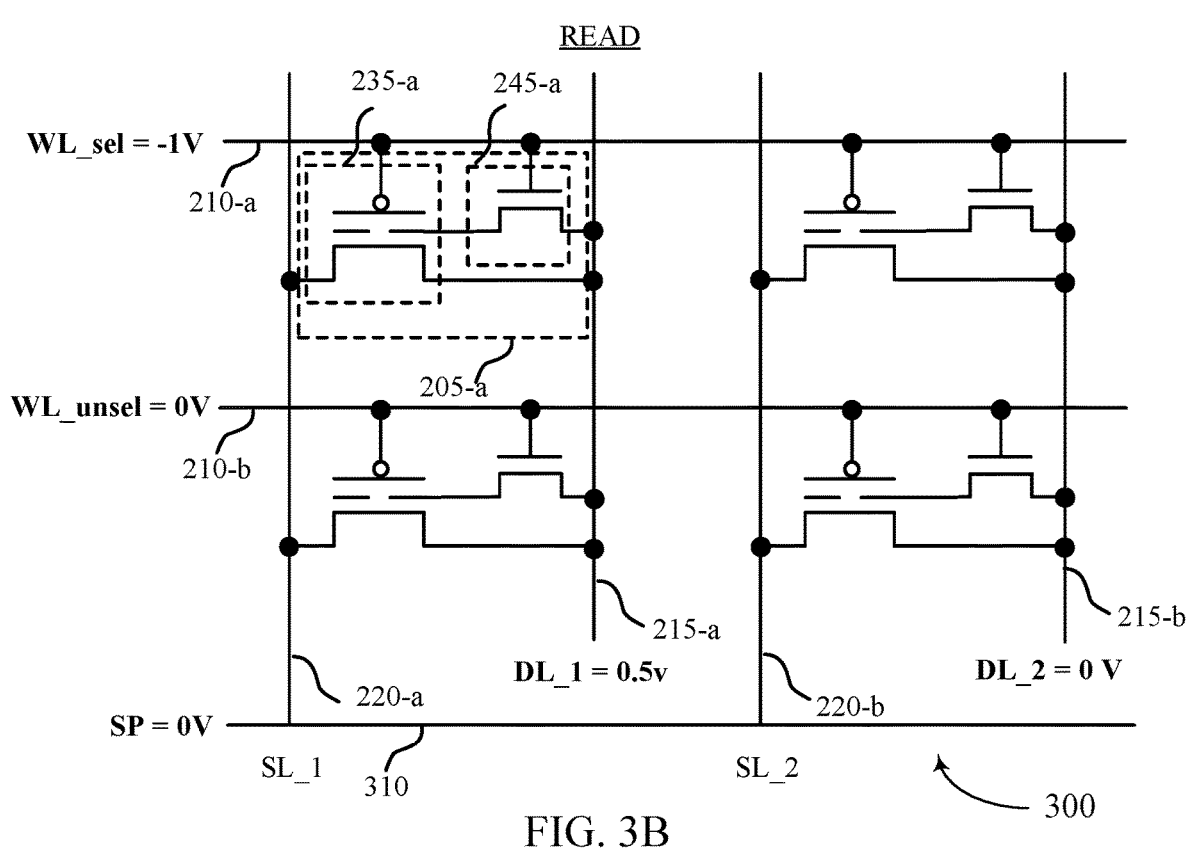

FIGS. 3A and 3B illustrate examples of access line biasing during write and read operations, respectively, of a memory device 300 that supports source line configurations for a memory device in accordance with examples as disclosed herein.

Memory device 300 includes multiple memory cells, including target memory cell 205-a. Target memory cell 205-a may be an example of a floating gate memory cell 205 described with reference to FIG. 2. Target memory cell 205-a includes a read transistor 235-a that is associated with a floating gate 240-a and a write transistor 245-a. In this example, read transistor 235-a is a p-type transistor and write transistor 245-a is an n-type transistor. In some cases, write transistors 245 in memory device 300 may be activated when a first voltage is applied to their control gate, and read transistors 235 in memory device 300 may be activated when a second (different) voltage is applied to their control gate. In this example, the write transistors 245-a may be activated when a voltage of three (3) volts is applied to their control gates, and read transistors 235 may be activated when a voltage of minus one (−1) volts is applied to their control gates. The values of voltages described in FIGS. 3A and 3B are meant as examples. The voltages may be any value or combinations of values that perform the functions described herein.

FIG. 3A depicts an example of access line biasing of a memory device 300 during a write operation. During a write operation on target memory cell 205-a, a word line 210-a associated with target memory cell 205-a may be biased to a write voltage that activates write transistor 245-a but does not activate read transistor 235-a. The write voltage may be applied, via word line 210-a, to a control gate of write transistor 245-a and may be a voltage that exceeds a threshold voltage associated with write transistor 245-a, for example. In this example, the write voltage may be three (3) volts. Other word lines in memory device 300 that are associated with unselected memory cells, such as word line 210-b, may be biased to zero (0) volts (e.g., a ground voltage).

During the write operation, a digit line 215-a associated with target memory cell 205-a may be biased to a state voltage that is based on the logic state to be written to target memory cell 205-a. For example, to write a logic state of "1," the digit line 215-*a* may be biased to two (2) volts. To write a logic state of "0," the digit line 215-*a* may be biased to zero (0) volts. Other digit lines in memory device 300 that are associated with unselected memory cells, such as digit line 215-*b*, may be biased to zero (0) volts (e.g., a ground voltage).

As described with reference to FIG. 2, a source node of write transistor 245-*a* may be coupled with digit line 215-*a* and a drain node of write transistor 245-*a* may be coupled with floating gate 240-*a*. Thus, when write transistor 245-*a* is activated by applying the write voltage to word line 210-*a*, a voltage may be applied to floating gate 240-*a* that is based on the state voltage applied to digit line 215-*a*. In some cases, the voltage applied to floating gate 240-*a* may be substantially the same as the state voltage on digit line 215-*a* minus any voltage drop across write transistor 245-*a*.

After the voltage is applied to floating gate 240-*a*, word line 210-*a* may be set to zero (0) volts to deactivate write transistor 245-*a*, thereby decoupling floating gate 240-*a* from digit line 215-*a*. Floating gate 240-*a* may be floating (e.g., uncoupled from any voltage sources or voltage rails) and may therefore store the voltage representing the logic state.

During the write operation, the source line 220-*a* associated with target memory cell 205-*a* may not be used and may be biased to zero (0) volts (e.g., a ground voltage). To simplify fabrication and source line biasing, in this example, multiple source lines 220 may be coupled with a single conductive source plate 310, which may be biased to zero (0) volts.

FIG. 3B depicts an example of access line biasing of the memory device 300 during a read operation of target memory cell 205-*a*. During a read operation on target memory cell 205-*a*, a word line 210-*a* associated with target memory cell 205-*a* may be biased to a read voltage that activates read transistor 235-*a* but does not activate write transistor 245-*a*. The read voltage may be applied, via word line 210-*a*, to a control gate of read transistor 235-*a* and may be a voltage that exceeds a nominal threshold voltage associated with read transistor 235-*a*, for example. The nominal threshold voltage may be the threshold voltage of read transistor 235-*a* when floating gate 240-*a* is uncharged. In this example, the read voltage may be minus one (−1) volts. Other word lines in memory device 300 that are associated with unselected memory cells, such as word line 210-*b*, may be biased to zero (0) volts (e.g., a ground voltage).

During the read operation, a digit line 215-*a* associated with target memory cell 205-*a* may be biased to a read voltage. In this example, the read voltage may be 0.5 volts, and may be the same voltage regardless of the logic state stored by target memory cell 205-*a*. Other digit lines in memory device 300 that are associated with unselected memory cells, such as digit line 215-*b*, may be biased to zero (0) volts.

As described with reference to FIG. 2, a drain node of read transistor 235-*a* may be coupled with digit line 215-*a* and a source node of read transistor 235-*a* may be coupled with source line 220-*a*. During the read operation, the digit line 215-*a* is biased to a higher voltage (e.g., 0.5 V) than the source line 220-*a*. Thus, when read transistor 235-*a* is activated by applying the read voltage to word line 210-*a*, a current may flow between digit line 215-*a* and source line 220-*a* via read transistor 235-*a*. The amount of current conducted by read transistor 235-*a* may depend on the voltage stored on floating gate 240-*a*. Thus, the amount of current flowing from digit line 215-*a* to source line 220-*a* may be sensed by a sense amplifier to determine the logic state stored by target memory cell 205-*a*.

In some cases, during a write operation of a logic state "1" (e.g., when the write voltage applied to the digit line 215-*a* is a relatively high voltage, such as two (2) volts), the read transistors 235-*a*, 235-*b* associated with digit line 215-*a* and source line 220-*a* may not be activated but may still conduct a small amount of electrical current, such as a leakage current, due to the voltage difference between the digit line 215-*a* and the source line 220-*a*. Although FIG. 3A depicts two memory cells coupled with digit line 215-*a* and source line 220-*a*, in practice there may be hundreds or thousands of memory cells coupled with these access lines. Thus, the cumulative leakage current that may be conducted through read transistors 235 during a write operation may be significant.

In some cases, therefore, it may be desirable to bias the source line 220 associated with a target memory cell 205 to the same voltage as the digit line 215 associated with the target memory cell 205 during a write operation to avoid a voltage difference between the digit line 215 and source line 220, and therefore reduce or eliminate the leakage current through the read transistors.

Figure 4:
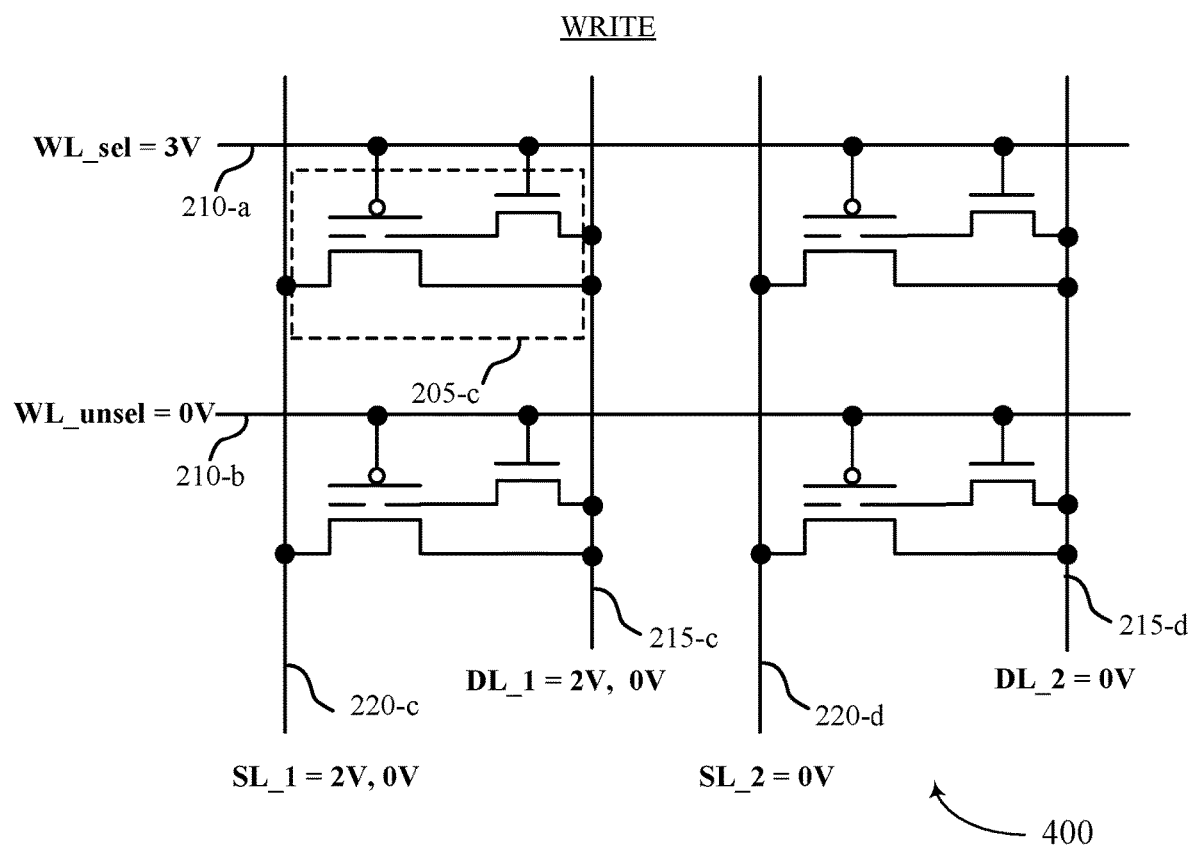
FIG. 4 illustrates an example of access line biasing of a memory device that supports source line configurations for a memory device in accordance with examples as disclosed herein.

FIG. 4 illustrates an example of access line biasing of a memory device 400 that supports source line configurations for a memory device in accordance with examples as disclosed herein. FIG. 4. depicts an example of access line biasing of memory device 400 during a write operation. The values of voltages described in FIG. 4 are meant as examples. The voltages may be any value or combinations of values that perform the functions described herein.

Memory device 400 is similar to memory device 300, but in this case, memory device 400 includes multiple source lines 220-*c*, 220-*d* that may be independently biased rather than being coupled with a single source plate, such as source plate 310 depicted in FIGS. 3A and 3B. Isolating source lines 220-*c*, 220-*d* from each other may allow a memory device to bias, during a write operation, a source line 220-*c* associated with a target memory cell 205-*c* to the voltage of the digit line 215-*c* associated with the target memory cell 205, thereby reducing or eliminating leakage current through read transistors associated with the source line 220-*c* and digit line 215-*c*. For example, if digit line 215-*c* is biased to two (2) volts (e.g., to write a logic state "1" to target memory cell 205-*c*), source line 220-*c* may also be biased to two (2) volts. If digit line 215-*c* is biased to zero (0) volts (e.g., to write a logic state "0" to target memory cell 205-*c*), source line 220-*c* may also be biased to zero (0) volts. In some cases, a single source line (e.g., source line 220-*c*) may be associated with a single digit line (e.g., digit line 215-*c*).

Source lines in memory device 400 that are not associated with the target memory cell 205-*c*, such as source line 220-*d*, may remain biased at zero (0) volts to reduce power consumption.

In some cases, source lines 220-*c*, 220-*d* may be individually biased by bringing each source line 220-*c*, 220-*d* out of the corresponding block of memory cells and coupling each source line to a voltage supply or voltage regulator such that each source line may be individually biased. This approach may not be feasible for some applications, however. Thus, alternative approaches to source line biasing may be useful.

Figure 5:
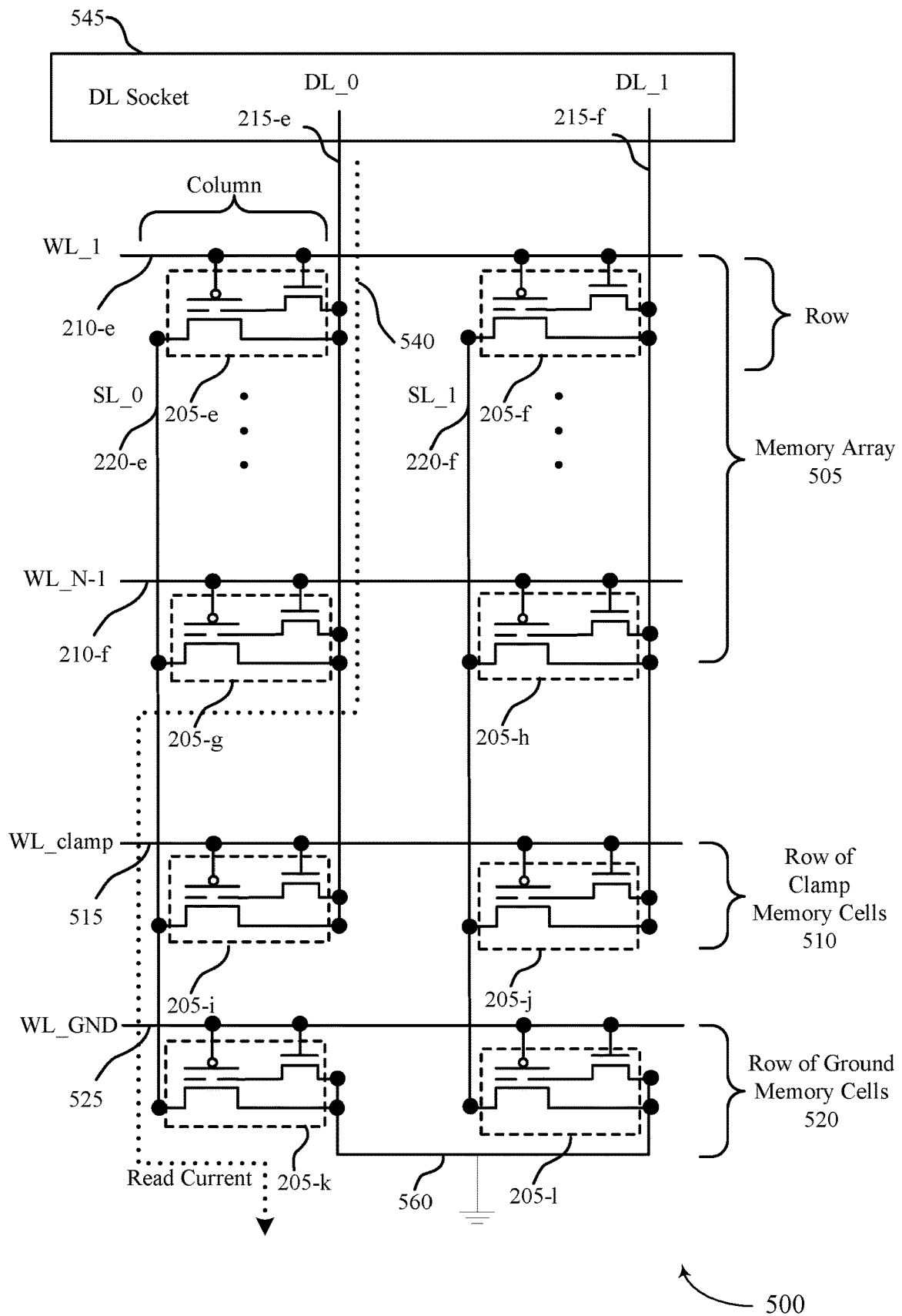
FIG. 5 illustrates an example of a memory device that supports source line configurations for a memory device in accordance with examples as disclosed herein.

FIG. 5 illustrates an example of a memory device 500 that supports source line configurations for a memory device in accordance with examples as disclosed herein.

Memory device 500 includes a memory array 505, which may be an example of memory array 170 described with reference to FIG. 1. Memory array 505 includes floating-gate memory cells 205-*e*, 205-*f*, 205-*g*, and 205-*f*. Each memory cell 205 in memory array 505 may be coupled with a word line 210, digit line 215, and source line 220 as described with reference to FIG. 2, for example. Digit lines 215 may be coupled with a digit line socket 545 that may be coupled with a digit line driver used to bias (apply voltages to) digit lines 215.

Memory array 505 may be organized as multiple rows and columns of memory cells 205. For example, memory array 505 has a first row including memory cells 205-*e*, 205-*f* and an Nth row including memory cells 205-*g*, 205-*h*. Memory array 505 has a first column that includes memory cells 205-*e*, 205-*g* and a second column that includes memory cells 205-*f*, 205-*h*.

Memory array 505 includes at least one row of clamp memory cells, including clamp memory cells 205-*i*, 205-*j*. Clamp memory cells 205-*i*, 205-*j* may be examples of floating-gate memory cells as described with reference to FIGS. 2 and 3, and may be associated with access lines that include a clamp line 515, source line 220, and digit line 215. Memory cells in the row of clamp memory cells 510 may be coupled with the source lines 220 and digit lines 215 of the memory array 505. Clamp line 515 may function as a word line for clamp memory cells 205-*i*, 205-*j*. The clamp line 515 may be coupled with the word line decoder and may be controlled by the word line decoder. Clamp memory cells 205-*i*, 205-*j* may not be used to store a logic state; instead, clamp memory cells 205-*i*, 205-*j* may be used to bias source lines 220 of memory array 505 during a write operation of a memory cell 205 in memory array 505.

Memory array 505 includes at least one row of ground memory cells 520, including ground memory cells 205-*k*, 205-*l*. Ground memory cells 205-*k*, 205-*l* may be examples of floating-gate memory cells as described with reference to FIGS. 2 and 3, and may be associated with access lines that include a ground line 525 and source line 220. Memory cells in the row of ground memory cells 520 may be coupled with the source lines 220 of the memory array 505. Ground line 525 may function as a word line for ground memory cells 205-*k*, 205-*l*. The ground line 525 may be coupled with the word line decoder and may be controlled by the word line decoder.

Unlike memory cells in memory array 505 and clamp memory cells in the row of clamp memory cells 510, ground memory cells 205-*k*, 205-*l* may not be coupled with digit lines 215. Instead, ground memory cells 205-*k*, 205-*l* may be coupled with a ground node 560 that is biased to a ground voltage; e.g., zero (0) volts. That is, the source of the write transistor and the drain of the read transistor in each ground memory cell 205-*k*, 205-*l* may be coupled with a ground node 560 instead of with a digit line 215. Ground memory cells 205-*k*, 205-*l* may not be used to store a logic state; instead, ground memory cells 205-*k*, 205-*l* may be used to bias source lines 220 of memory array 505 during a read operation of a memory cell 205 in memory array 505.

During a write operation of a target memory cell 205 in memory array 505, clamp line 515 may be biased to a read voltage that activates the read transistors in clamp memory cells 205-*i*, 205-*j*, and ground line 525 may be biased to a voltage that keeps the read transistors and write transistors in the ground memory cells 205-*k*, 205-*l* inactive. For example, the clamp line 515 may be biased to minus two (−2) volts, and the ground line 525 may be biased to zero (0) volts.

Activating the read transistors in clamp memory cells 205-*i*, 205-*j* during a write operation may couple a digit line 215 associated with the target memory cell 205 with a source line 220 associated with the target memory cell 205, thereby clamping the source line 220 with the digit line 215 and biasing the source line 220 to the voltage of the digit line 215. As previously described, biasing the source line 220 to the same voltage as the digit line 215 during a write operation may reduce or eliminate leakage current that may flow between the digit line 215 and the source line 220 during the write operation.

During a read operation of a target memory cell 205 in memory array 505, ground line 525 may be biased to a read voltage that activates the read transistors in ground memory cells 205-*k*, 205-*l*, and clamp line 515 may be biased to a voltage that keeps the read transistors and write transistors in the clamp memory cells 205-*i*, 205-*j* inactive. For example, the ground line 525 may be biased to minus two (−2) volts, and the clamp line 515 may be biased to zero (0) volts, which may be the opposite of the biasing used during a write operation.

Activating the read transistors in ground memory cells 205-*k*, 205-*l* may couple a source line 220 associated with the target memory cell 205 with a ground node 560 that is biased to a ground voltage, thereby biasing the source line 220 to the ground voltage. As described with reference to FIGS. 2 and 3B, the digit line 215 associated with the target memory cell 205 may be biased to a voltage such that a current may flow from the digit line 215 to the source line 220 via the read transistor in the target memory cell 205.

For example, if memory cell 205-*g* is the target memory cell during a read operation, a current may flow along current path 540 as shown, from the digit line driver associated with the digit line socket 545 through digit line 215-*e*, through memory cell 205-*g* (e.g., through a read transistor of memory cell 205-*g*) to source line 220-*e*, then back through ground memory cell 205-*k* (e.g., through a read transistor of ground memory cell 205-*k*) to the ground node 560.

As described above, one or more rows of clamp memory cells 510 and one or more rows of ground memory cells 520, each of which are coupled with memory array 505, may enable a memory device to bias source lines associated with floating-gate memory cells using on-die circuitry that may be fabricated and controlled in the same manner as the floating-gate memory cells. This technique may reduce or eliminate the need to bring source lines out of a block of memory cells associated with the memory device (e.g., out of a patch or tile of memory cells) for biasing the source lines. Although FIG. 5 depicts a single row of clamp memory cells 510 and a single row of ground memory cells 520, in practice there may be multiple rows of each. In some cases, the clamp memory cells and ground memory cells may each may be implemented with multiple rows operating in parallel. The quantity of rows may be chosen for sufficient drive strength.

In some cases, it may be desirable for all of the read transistors of the clamp memory cells and ground memory cells to operate in a high-current (low threshold) state. In some cases, this state may be achieved by including the clamp line(s) and ground line(s) in a refresh scheme. That is, the clamp memory cells and ground memory cells may be refreshed during operation of the memory device. During refresh on those rows, the digit lines may remain at zero (0) volts and the clamp line(s) and ground line(s) may be raised to a high voltage. This technique may keep the floating gates in the clamp memory cells and ground memory cells at zero (0) volts using the write transistors in these cells, which may be similar to writing zeros to the floating gates. In some cases, one or more clamp rows and one or more ground rows may also be initialized in a similar manner upon powerup.

Figure 6:
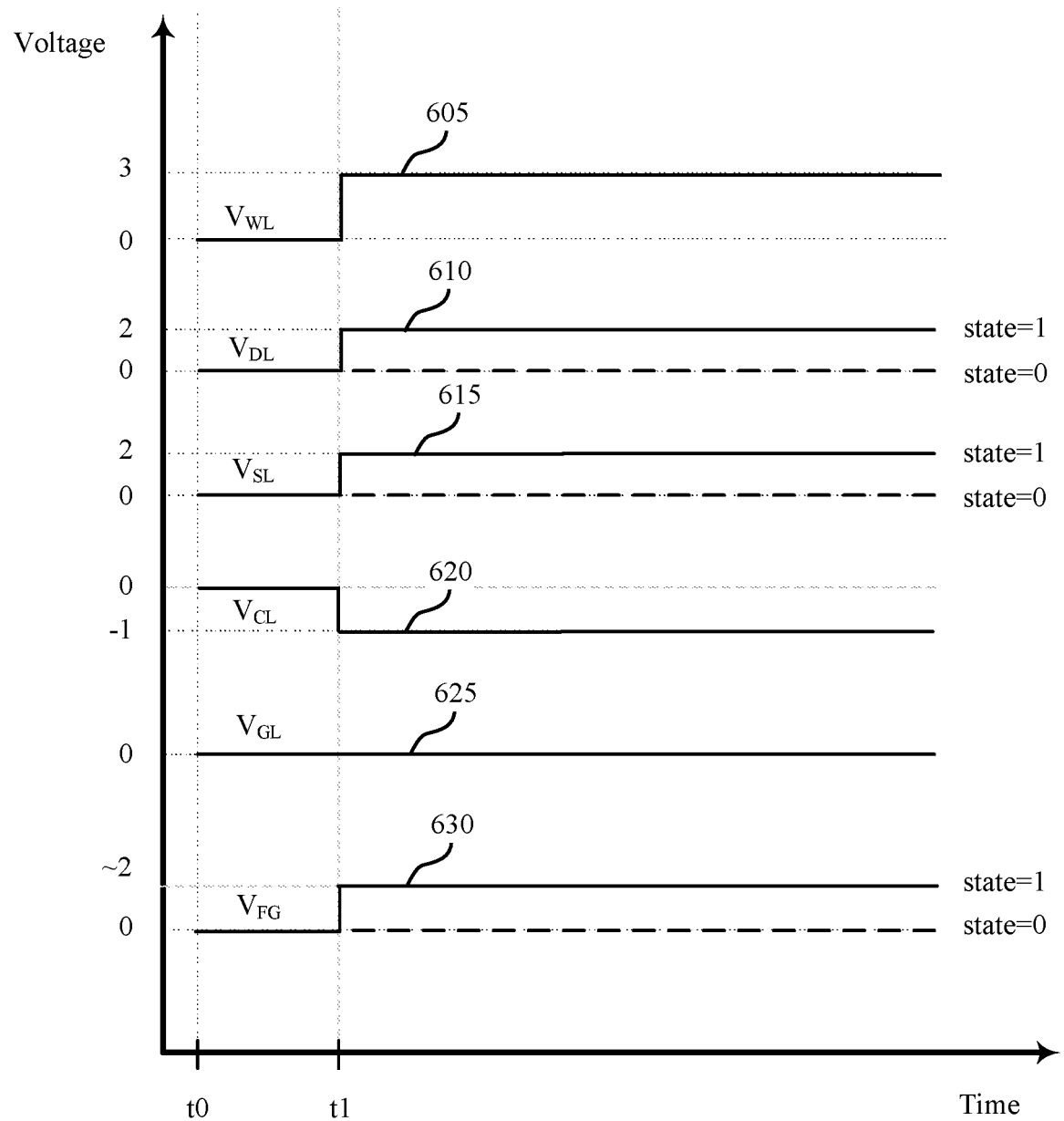
FIG. 6 illustrates an example of a timing diagram that supports source line configurations for a memory device in accordance with examples as disclosed herein.

FIG. 6 illustrates an example of a timing diagram 600 that supports source line configurations for a memory device in accordance with examples as disclosed herein. Timing diagram 600 may depict voltages on various access lines associated with a target memory cell during a write operation. Timing diagram includes word line voltage $V_{WL}$ 605, digit line voltage $V_{DL}$ 610, source line voltage $V_{SL}$ 615, clamp line voltage $V_{CL}$ 620, and ground line voltage $V_{GL}$ 625. Timing diagram 600 also includes a voltage of a floating gate $V_{FG}$ 630. The values of voltages described in FIG. 6 are meant as examples. The voltages may be any value or combinations of values that perform the functions described herein.

At time t0, the target memory cell and corresponding access lines may be idle, and the floating gate may be storing a state of "0." Thus, $V_{WL}$ 605, $V_{DL}$ 610, $V_{SL}$ 615, $V_{CL}$ 620, and $V_{GL}$ 625 may all be biased to zero (0) volts, and $V_{FG}$ 630 may store a voltage of zero (0) volts.

At time t1, a write operation may be performed. $V_{WL}$ 605 may be biased to a write voltage of three (3) volts to activate a write transistor in the target memory cell. $V_{DL}$ 610 may be biased to either two (2) volts to write a logic state "1" or zero (0) volts to write a logic state "0." $V_{CL}$ 620 may be set to minus one (−1) volts to activate the read transistors in the clamp memory cells, thereby clamping the source line associated with the target memory cell to the digit line associated with the target memory cell as described with reference to FIG. 5. Thus, $V_{SL}$ 615 may be equal to $V_{DL}$ 610. Because the write transistor is activated, thereby coupling the digit line with the floating gate and applying a voltage to the floating gate, $V_{FG}$ 630 may develop a voltage that is based on the voltage of $V_{DL}$ 610. For example $V_{FG}$ 630 may develop a higher voltage (e.g., approximately two (2) volts) when $V_{DL}$ 610 is biased to two (2) volts and a lower voltage (e.g., zero (0) volts) when $V_{DL}$ 610 is biased to zero (0) volts. $V_{GL}$ 625 may remain inactive at zero (0) volts during the write operation.

At some time after time t1, $V_{WL}$ 605 may be biased to zero (0) volts (not shown) to deactivate the read transistor and store the logic state on the floating gate.

Figure 7:
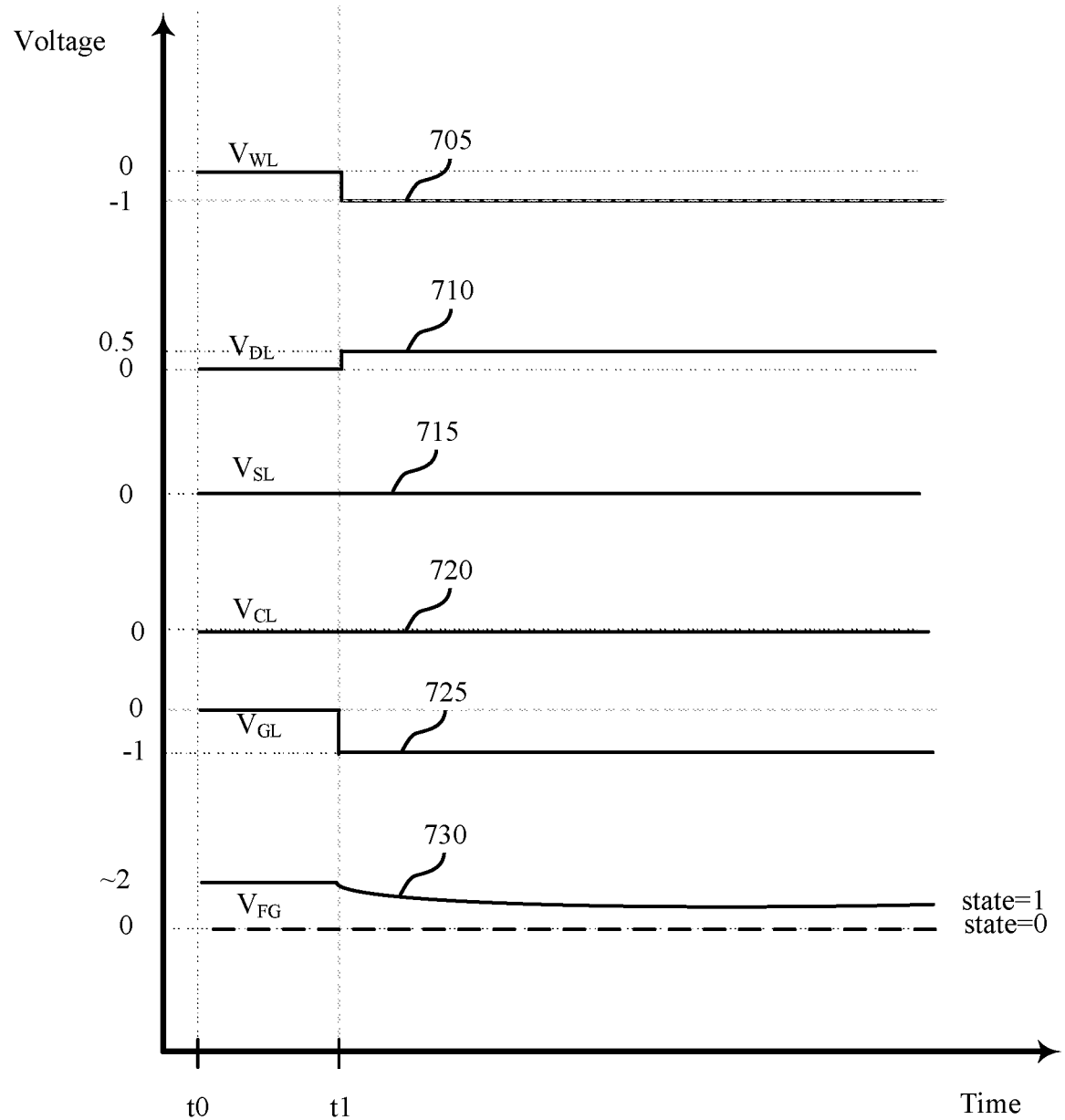
FIG. 7 illustrates an example of a timing diagram that supports source line configurations for a memory device in accordance with examples as disclosed herein.

FIG. 7 illustrates an example of a timing diagram 700 that supports source line configurations for a memory device in accordance with examples as disclosed herein. Timing diagram 700 may depict voltages of various access lines associated with a target memory cell during a read operation. Timing diagram includes word line voltage $V_{WL}$ 705, digit line voltage $V_{DL}$ 710, source line voltage $V_{SL}$ 715, clamp line voltage $V_{CL}$ 720, and ground line voltage $V_{GL}$ 725. Timing diagram 700 also includes a voltage of a floating gate $V_{FG}$ 730. The values of voltages described in FIG. 6 are meant as examples. The voltages may be any value or combinations of values that perform the functions described herein.

At time t0, the target memory cell and corresponding access lines may be idle, and the floating gate may be storing a state of either "0" or "1." Thus, $V_{WL}$ 705, $V_{DL}$ 710, $V_{SL}$ 715, $V_{CL}$ 720, and $V_{GL}$ 725 may all be biased to zero (0) volts, and $V_{FG}$ 730 may store a voltage of either approximately two (2) volts or zero (0) volts.

At time t1, a read operation may be performed. $V_{WL}$ 705 may be biased to a read voltage of minus one (−1) volts to activate a read transistor in the target memory cell. $V_{DL}$ 710 may be biased to a small positive voltage, such as 0.5 volts. $V_{GL}$ 725 may be set to minus one (−1) volts to activate the read transistors in the ground memory cells, thereby grounding the source line associated with the target memory cell as described with reference to FIG. 5. Thus, $V_{SL}$ 715 may remain at zero (0) volts during the read operation.

Because the read transistor of the target memory cell is activated to couple the source line (biased to zero (0) volts) with the digit line (biased to 0.5 volts), a current may flow from the digit line to the source line through the read transistor. The amount of current that may flow through the read transistor may be affected by the voltage of the floating gate $V_{FG}$ 730. If $V_{FG}$ 730 at the beginning of the read operation is approximately two (2) volts (representing a logic state "1"), more current may flow than if $V_{FG}$ 730 at the beginning of the read operation is zero (0) volts (representing a logic state "0"). In the former case, the $V_{FG}$ 730 may decrease slightly during the read operation. $V_{CL}$ 720 may remain inactive at zero (0) volts during the read operation.

Figure 8:
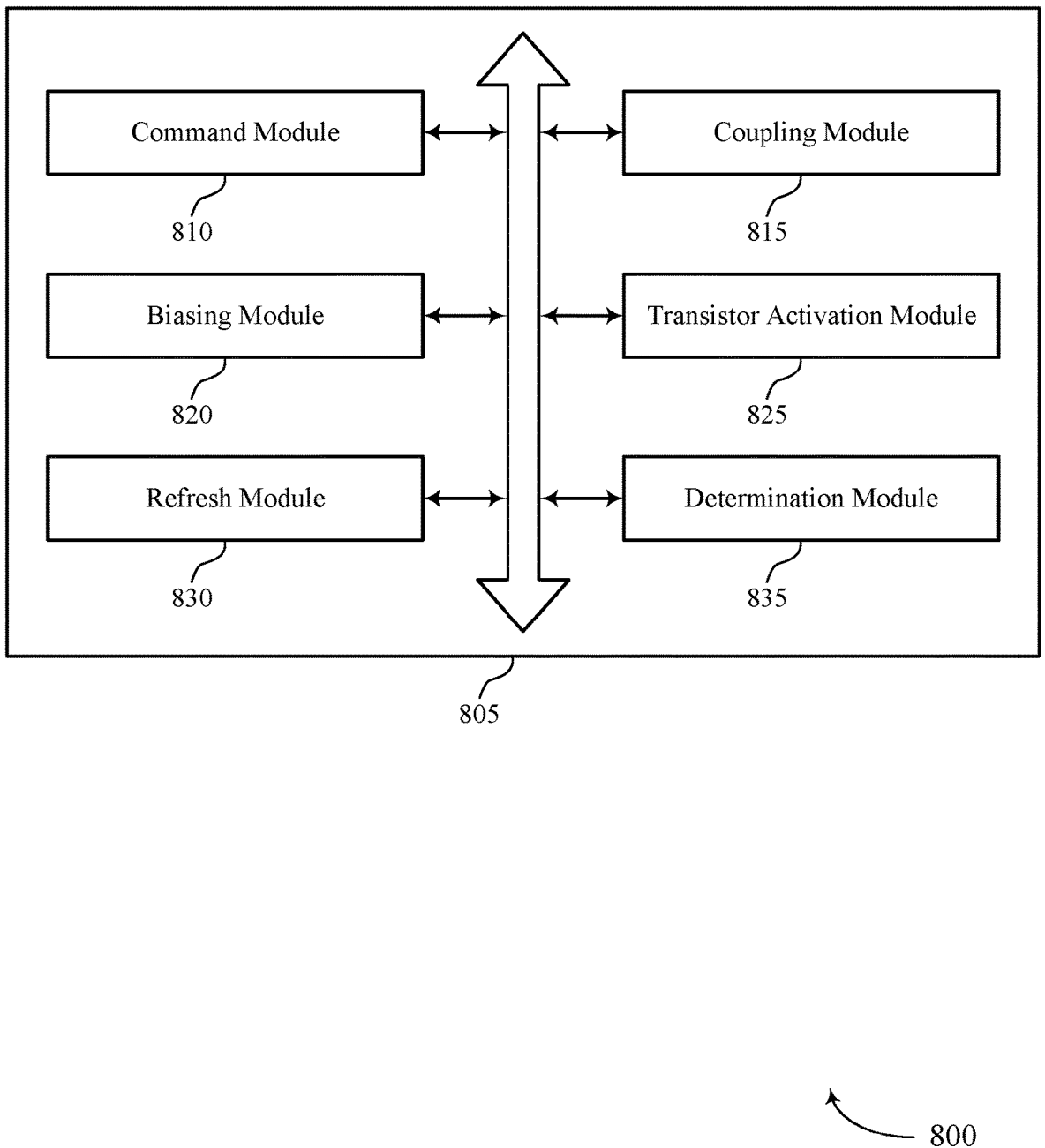
FIG. 8 shows a block diagram of a memory device that supports source line configurations for a memory device in accordance with examples as disclosed herein.

FIG. 8 shows a block diagram 800 of a memory device 805 that supports source line configurations for a memory device in accordance with examples as disclosed herein. The memory device 805 may be an example of aspects of memory devices or memory arrays described with reference to FIGS. 1-5, for example. The memory device 805 may include a command module 810, a coupling module 815, a biasing module 820, a transistor activation module 825, a refresh module 830, and a determination module 835. Each of these modules may communicate, directly or indirectly, with one another (e.g., via one or more buses).

The command module 810 may receive a command to perform a write operation on a memory cell that includes a first transistor having a floating gate for storing a logic state of the memory cell and a second transistor connected with the floating gate of the first transistor.

The command module 810 may receive a command to perform a read operation on a memory cell that includes a first transistor having a floating gate for storing a logic state of the memory cell and a second transistor connected with the floating gate of the first transistor.

The coupling module 815 may couple, based on receiving the command, a source line connected to the first transistor with a digit line connected to the second transistor. In some examples, the coupling module 815 may decouple the source line from the digit line.

The biasing module 820 may apply a first voltage to the digit line as part of the write operation. In some examples, the biasing module 820 may ground a source line coupled with the first transistor of the memory cell. In some examples, the biasing module 820 may apply, as part of the read operation, a first voltage to a digit line that is connected with the second transistor of the memory cell.

In some examples, the biasing module 820 may apply, based on receiving the command, a fourth voltage to a word line associated with the memory cell, the word line connected with a control gate of the first transistor and with a gate of the second transistor.

In some examples, the biasing module 820 may apply the fourth voltage to the word line activates the second transistor without activating the first transistor.

In some examples, the biasing module 820 may apply, as part of the read operation, a second voltage to a word line that is connected with a control gate of the first transistor to activate the first transistor. In some cases, the word line is connected with a gate of the second transistor, and where applying the second voltage to the word line does not activate the second transistor.

The transistor activation module 825 may activate the second transistor to apply a second voltage to the floating gate of the first transistor, the second voltage based on the first voltage.

In some examples, the transistor activation module 825 may deactivate the second transistor to cause the first transistor to store a logic state that is based on the second voltage applied to the floating gate of the first transistor. In some examples, the command module 810 may receive a second command to perform a read operation on the memory cell after deactivating the second transistor. In some examples, the refresh module 830 may refresh the second memory cell after deactivating the second transistor. In some examples, the refresh module 830 may refresh the second memory cell by applying a third voltage to the control gate of the third transistor. In some cases, refreshing of the second memory cell occurs after determining the logic state stored by the memory cell.

In some examples, the transistor activation module 825 may activate a third transistor in a second memory cell, the third transistor having a first node connected with the digit line, a second node connected with the source line, and a floating gate. In some examples, activating the third transistor includes applying a third voltage to a control gate of the third transistor, the third transistor having a floating gate.

In some examples, the transistor activation module 825 may activate a fourth transistor in a third memory cell to couple the source line with a ground voltage as part of the read operation.

In some examples, the transistor activation module 825 may activate a third transistor in a second memory cell, the third transistor having a first node connected with the source line, a second node connected with a ground voltage, and a floating gate. In some examples, activating the third transistor includes applying a second voltage to a control gate of the third transistor.

The determination module 835 may determine the logic state stored by the memory cell based on a signal on the digit line during at least a portion of a duration that the source line is grounded. In some examples, the determination module 835 may determine a second logic state of the memory cell while the source line is coupled with the ground voltage. In some examples, the determination module 835 may determine the logic state stored by the memory cell is based on activating the first transistor, the signal on the digit line based on a voltage of the floating gate of the first transistor.

In some examples, determining the state stored by the floating gate of the first transistor includes determining an electrical current associated with the signal on the digit line.

Figure 9:
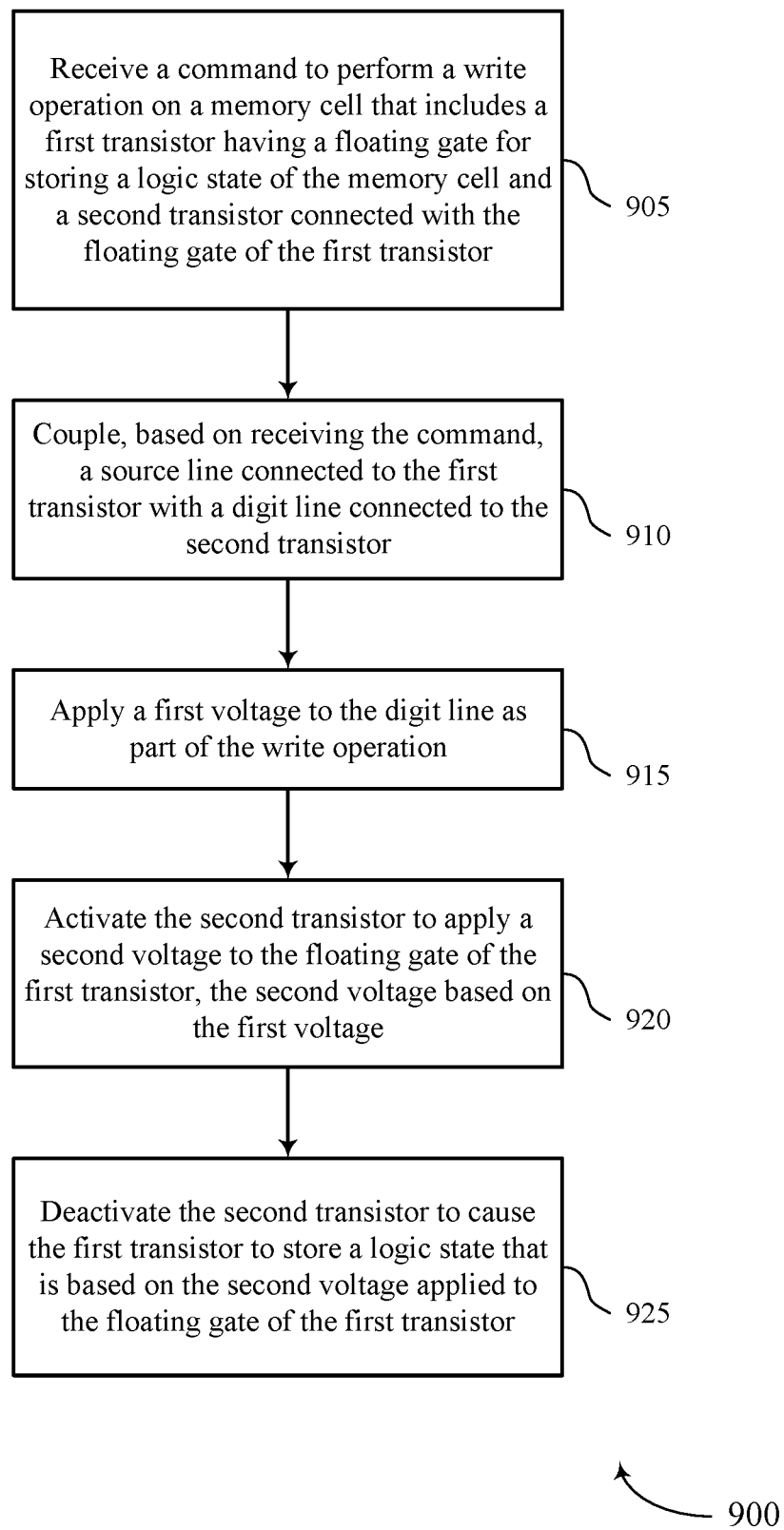
FIGS. 9 and 10 show flowcharts illustrating a method or methods that support supports source line configurations for a memory device in accordance with examples as disclosed herein.

FIG. 9 shows a flowchart illustrating a method or methods 900 that supports source line configurations for a memory device in accordance with aspects of the present disclosure. The operations of method 900 may be implemented by a memory device or its components as described herein. For example, the operations of method 900 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 905, the memory device may receive a command to perform a write operation on a memory cell that includes a first transistor having a floating gate for storing a logic state of the memory cell and a second transistor connected with the floating gate of the first transistor. The operations of 905 may be performed according to the methods described herein. In some examples, aspects of the operations of 905 may be performed by a command module as described with reference to FIG. 8.

At 910, the memory device may couple, based on receiving the command, a source line connected to the first transistor with a digit line connected to the second transistor. The operations of 910 may be performed according to the methods described herein. In some examples, aspects of the operations of 910 may be performed by a coupling module as described with reference to FIG. 8.

At 915, the memory device may apply a first voltage to the digit line as part of the write operation. The operations of 915 may be performed according to the methods described herein. In some examples, aspects of the operations of 915 may be performed by a biasing module as described with reference to FIG. 8.

At 920, the memory device may activate the second transistor to apply a second voltage to the floating gate of the first transistor, the second voltage based on the first voltage. The operations of 920 may be performed according to the methods described herein. In some examples, aspects of the operations of 920 may be performed by a transistor activation module as described with reference to FIG. 8.

At 925, the memory device may deactivate the second transistor to cause the first transistor to store a logic state that is based on the second voltage applied to the floating gate of the first transistor. The operations of 925 may be performed according to the methods described herein. In some examples, aspects of the operations of 925 may be performed by a transistor activation module as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for receiving a command to perform a write operation on a memory cell that includes a first transistor having a floating gate for storing a logic state of the memory cell and a second transistor connected with the floating gate of the first transistor, coupling, based on receiving the command, a source line connected to the first transistor with a digit line connected to the second transistor, applying a first voltage to the digit line as part of the write operation, activating the second transistor to apply a second voltage to the floating gate of the first transistor, the second voltage based on the first voltage, and deactivating the second transistor to cause the first transistor to store a logic state that is based on the second voltage applied to the floating gate of the first transistor.

In some examples of the method 900 and the apparatus described herein, coupling the source line with the digit line may include operations, features, means, or instructions for activating a third transistor in a second memory cell, the third transistor having a first node connected with the digit line, a second node connected with the source line, and a floating gate.

In some examples of the method 900 and the apparatus described herein, activating the third transistor may include operations, features, means, or instructions for applying a third voltage to a control gate of the third transistor, the third transistor having a floating gate.

Some examples of the method 900 and the apparatus described herein may further include operations, features, means, or instructions for refreshing the second memory cell after deactivating the second transistor.

Some examples of the method 900 and the apparatus described herein may further include operations, features, means, or instructions for applying, based on receiving the command, a fourth voltage to a word line associated with the memory cell, the word line connected with a control gate of the first transistor and with a gate of the second transistor.

Some examples of the method 900 and the apparatus described herein may further include operations, features, means, or instructions for applying the fourth voltage to the word line activates the second transistor without activating the first transistor.

Some examples of the method 900 and the apparatus described herein may further include operations, features, means, or instructions for receiving a second command to perform a read operation on the memory cell after deactivating the second transistor, decoupling the source line from the digit line, activating a fourth transistor in a third memory cell to couple the source line with a ground voltage as part of the read operation, and determining a second logic state of the memory cell while the source line may be coupled with the ground voltage.

Figure 10:
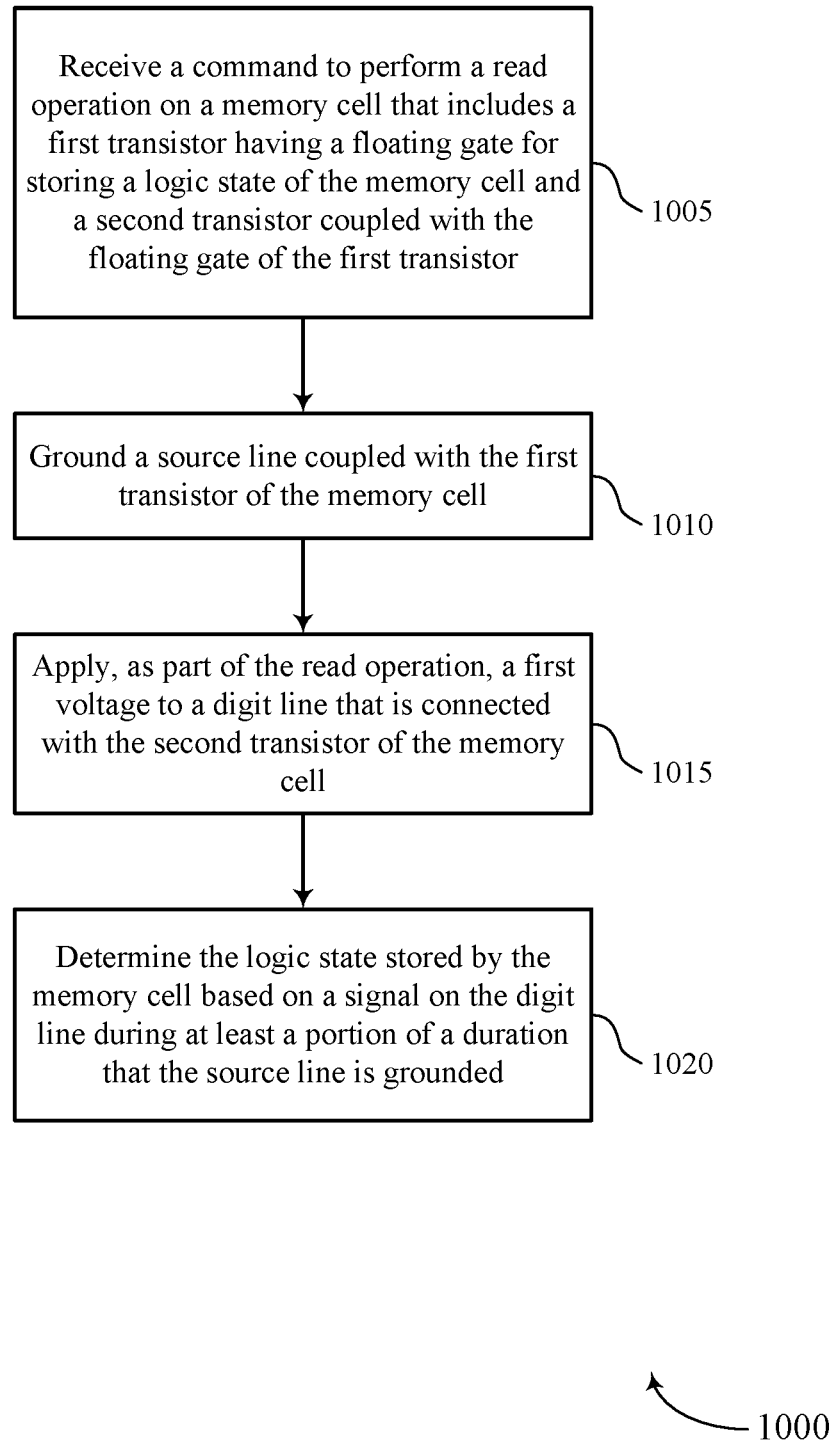

FIG. 10 shows a flowchart illustrating a method or methods 1000 that supports source line configurations for a memory device in accordance with aspects of the present disclosure. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may receive a command to perform a read operation on a memory cell that includes a first transistor having a floating gate for storing a logic state of the memory cell and a second transistor coupled with the floating gate of the first transistor. The operations of 1005 may be performed according to the methods described herein. In some examples, aspects of the operations of 1005 may be performed by a command module as described with reference to FIG. 8.

At 1010, the memory device may ground a source line coupled with the first transistor of the memory cell. The operations of 1010 may be performed according to the methods described herein. In some examples, aspects of the operations of 1010 may be performed by a biasing module as described with reference to FIG. 8.

At 1015, the memory device may apply, as part of the read operation, a first voltage to a digit line that is connected with the second transistor of the memory cell. The operations of 1015 may be performed according to the methods described herein. In some examples, aspects of the operations of 1015 may be performed by a biasing module as described with reference to FIG. 8.

At 1020, the memory device may determine the logic state stored by the memory cell based on a signal on the digit line during at least a portion of a duration that the source line is grounded. The operations of 1020 may be performed according to the methods described herein. In some examples, aspects of the operations of 1020 may be performed by a determination module as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for receiving a command to perform a read operation on a memory cell that includes a first transistor having a floating gate for storing a logic state of the memory cell and a second transistor coupled with the floating gate of the first transistor, grounding a source line coupled with the first transistor of the memory cell, applying, as part of the read operation, a first voltage to a digit line that is connected with the second transistor of the memory cell, and determining the logic state stored by the memory cell based on a signal on the digit line during at least a portion of a duration that the source line is grounded.

In some examples of the method 1000 and the apparatus described herein, grounding the source line may include operations, features, means, or instructions for activating a third transistor in a second memory cell, the third transistor having a first node connected with the source line, a second node connected with a ground voltage, and a floating gate.

In some examples of the method 1000 and the apparatus described herein, activating the third transistor may include operations, features, means, or instructions for applying a second voltage to a control gate of the third transistor.

Some examples of the method 1000 and the apparatus described herein may further include operations, features, means, or instructions for refreshing the second memory cell by applying a third voltage to the control gate of the third transistor.

In some examples of the method 1000 and the apparatus described herein, the refreshing of the second memory cell occurs after determining the logic state stored by the memory cell.

Some examples of the method 1000 and the apparatus described herein may further include operations, features, means, or instructions for applying, as part of the read operation, a second voltage to a word line that may be connected with a control gate of the first transistor to activate the first transistor.

Some examples of the method 1000 and the apparatus described herein may further include operations, features, means, or instructions for determining the logic state stored by the memory cell may be based on activating the first transistor, the signal on the digit line based on a voltage of the floating gate of the first transistor.

In some examples of the method 1000 and the apparatus described herein, the word line may be connected with a gate of the second transistor, and where applying the second voltage to the word line does not activate the second transistor.

In some examples of the method 1000 and the apparatus described herein, determining the state stored by the floating gate of the first transistor may include operations, features, means, or instructions for determining an electrical current associated with the signal on the digit line.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (OV) but that is not directly coupled with ground. Accordingly, the voltage of a virtual ground may temporarily fluctuate and return to approximately OV at steady state. A virtual ground may be implemented using various electronic circuit elements, such as a voltage divider consisting of operational amplifiers and resistors. Other implementations are also possible. "Virtual grounding" or "virtually grounded" means connected to approximately OV.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices described herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor described herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    an array of memory cells, each memory cell of the array of memory cells comprising a first transistor that includes a control gate and a floating gate and a second transistor connected with the floating gate of the first transistor, wherein each memory cell is configured to store a logic state using the first transistor and second transistor;
    a plurality of word lines, each word line connected with control gates of the first transistors and gates of the second transistors of memory cells of a row of the array;
    a plurality of digit lines, each digit line connected with a first node of the first transistors and a second node of the second transistors of memory cells of a column of the array; and
    a plurality of source lines, each source line corresponding to one digit line of the plurality of digit lines and connected with a second node of the first transistor of a respective memory cell that is connected with the one digit line, each source line configured to be biased based on an operation being performed using the one digit line.

2. The apparatus of claim 1, further comprising:
    a clamp row of memory cells coupled with the array of memory cells, each memory cell of the clamp row of memory cells comprising a third transistor that includes a floating gate and a fourth transistor connected with the floating gate of the third transistor, wherein a first node of each of the third transistors is connected with a corresponding source line of the plurality of source lines; and
    a clamp line connected with a control gate of each of the third transistors and configured to bias the corresponding source line to a voltage of the one digit line based on the operation being a write operation.

3. The apparatus of claim 2, wherein a second node of each of the third transistors is connected with the corresponding one digit line.

4. The apparatus of claim 2, wherein the clamp line is configured to bias the corresponding source line to the voltage of the one digit line by activating the each of the third transistors to couple the corresponding source line with the one digit line.

5. The apparatus of claim 2, wherein a third node of each of the fourth transistors is connected with the corresponding one digit line and a gate of each of the fourth transistors is connected with the clamp line.

6. The apparatus of claim 1, further comprising:
    a ground row of memory cells coupled with the array of memory cells, each memory cell of the ground row of memory cells comprising a fifth transistor that includes a floating gate and a sixth transistor coupled with the floating gate of the fifth transistor, wherein a first node of each of the fifth transistors is connected with a corresponding source line of the plurality of source lines; and
    a ground line connected with a control gate of each of the fifth transistors and configured to bias the corresponding source line to a ground voltage based on the operation being a read operation.

7. The apparatus of claim 6, wherein a second node of each of the fifth transistors is connected with the ground voltage.

8. The apparatus of claim 6, wherein the ground line is configured to bias the corresponding source line to the ground voltage by activating the each of the fifth transistors to couple the corresponding source line with the ground voltage.

9. The apparatus of claim 1, wherein the first transistor of each memory cell is a p-type transistor and the second transistor of each memory cell is an n-type transistor.

* * * * *